（12) United States Patent
Haman

(10) Patent No.: US 6,377,130 B1
(45) Date of Patent: Apr. 23, 2002

(54) TEMPERATURE STABILIZED CMOS OSCILLATOR CIRCUIT

(75) Inventor: Leo J. Haman, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/660,014

(22) Filed: Sep. 12, 2000

(51) Int. Cl.[7] .................................................. H03B 5/12
(52) U.S. Cl. .......................... 331/176; 331/186; 331/66; 331/158; 331/116 FE; 331/116 R
(58) Field of Search .................................. 331/186, 176, 331/117 R, 158, 116 R, 66, 116 FE

(56) References Cited

U.S. PATENT DOCUMENTS 5,341,112 A   8/1994   Haman ................... 331/116 R Primary Examiner—Arnold Kinkead
(74) Attorney, Agent, or Firm—Nathan O. Jensen; Kyle Eppele

(57) ABSTRACT

A temperature stabilized CMOS oscillator circuit modifies the gain of a CMOS oscillator transistor to cancel the gain variation over temperature using a bias circuit. The bias circuit utilizes a combination of two current mirrors to establish a temperature compensating supply current to a CMOS oscillator transistor. A primary current mirror and a temperature variable resistor establish a current in the current mirror output to the CMOS oscillator transistor. A secondary current mirror and a temperature variable resistor divert current from the primary current mirror over temperature to vary the current mirror output to the CMOS oscillator transistor to compensate for its gain variation.

7 Claims, 1 Drawing Sheet

TEMPERATURE STABILIZED CMOS OSCILLATOR CIRCUIT

BACKGROUND OF THE INVENTION

The present invention relates generally to oscillators, crystal oscillators, and more particularly to stabilizing circuits for crystal oscillators to ensure operation over temperature changes.

Requirements for smaller, lower power, and less expensive electronics have lead to more integration to achieve these goals. Many circuit functions are being combined onto a single silicon die. One of the most inexpensive of integration processes is bulk CMOS well known in the art. There are many advantages to using CMOS including low power, high-density integration, and low cost. One problem with the CMOS process is a wide variation of transistor gain over a temperature range of −55° C. to +105° C. typically required for military and some commercial applications.

Providing a high-stability reference frequency from a frequency standard is an important part of many communication and navigation systems operating in environments subject to substantial variations in temperature. Typically, the reference frequency is provided using a transistor-driven oscillator circuit having a crystal to establish a selected operating frequency. For example, feedback oscillator circuits, such as the Colpitts, Pierce or Hartley types, operate by returning a portion of the output signal to the input to sustain oscillation by positive feedback. Achieving a reference frequency that is highly stable in such a transistor-driven oscillator circuit typically requires use of a temperature-controlled quartz-crystal oscillator.

When using CMOS transistors to develop high-stability frequency standards, the variation of transistor gain with temperature presents problems for many of the functions of the frequency standard, especially the oscillator circuit itself. Quartz crystals used in high-stability frequency standards in many applications have an optimum operating current. If the crystal drive current is too high, the crystal will exhibit discontinuities in the crystal response curve (activity dips). The crystal may operate in spurious modes if the drive current is too high. If the crystal drive current is too low the crystal oscillator will not start operating over all temperatures. The transistor gain variation in an integrated CMOS process can vary in excess of 2 to 1 over temperature. This variation makes it very difficult to design an oscillator circuit that has good start up over temperature and at the same time does not cause activity dips in the crystal.

U.S. Pat. No. 5,341,112 entitled TEMPERATURE STABLE OSCILLATOR CIRCUIT APPARATUS by Leo J. Haman and assigned to the assignee of the present invention discloses a crystal oscillator with a bias circuit that controls the bias by controlling the emitter voltage of a bipolar transistor. The bipolar-transistor crystal oscillator circuit is a modified version of a conventional transistor crystal oscillator, such as a Hartley, Pierce or Colpitts-type circuit. The bias circuit includes a current source providing a reference current through a Schottky diode and a pair of bipolar transistors. The bipolar transistor crystal oscillator includes a bias input coupled to the bias circuit. The bipolar-transistor crystal oscillator provides a second current through a second bipolar transistor. The second current tracks the reference current so that the output of the bipolar transistor-driven oscillator circuit is substantially constant over variations in ambient temperature. The invention disclosed in the referenced patent is suitable for use with a bipolar transistor oscillator.

What is needed is a CMOS transistor crystal oscillator circuit that offers stable gain characteristics over temperature for use in reliable high-stability frequency standards.

SUMMARY OF THE INVENTION

A temperature stabilized CMOS oscillator circuit with stabilized gain over temperature is disclosed. The temperature stabilized oscillator comprises a crystal oscillator with a CMOS transistor. A bias circuit is connected to the crystal oscillator as a current source to provide a supply current to the CMOS oscillator transistor and to vary the supply current over temperature to provide the stabilized gain. The bias circuit includes a primary current mirror connected to the crystal oscillator to provide the supply current to the CMOS oscillator transistor. A secondary current mirror is connected to the primary current mirror to divert current from the primary current mirror to vary the supply current over temperature. The CMOS crystal oscillator may be a Pierce, Colpitts, Clapp, or Hartley oscillator known in the art. The primary current mirror has a primary pair of CMOS transistors connected as a current source. A resistor with a low positive temperature coefficient is connected to the primary pair of transistors to set a primary current mirror current that sets the supply current. The secondary current mirror has a secondary pair of CMOS transistors connected as a current source. A resistor with a high positive temperature coefficient is connected to the secondary pair of transistors to set a secondary current mirror current that diverts current from the primary current mirror current over temperature.

It is an object of the present invention to provide a CMOS transistor crystal oscillator circuit that offers stable gain characteristics over temperature for use in reliable high-stability frequency standards.

It is an advantage of the present invention to utilize two current mirrors to provide a temperature compensating current to an oscillator transistor.

It is a feature of the present invention to be able to incorporate the temperature stabilized CMOS oscillator circuit in a low power, low cost, and high integration density CMOS integrated circuit process.

BRIEF DESCRIPTION OF THE DRAWINGS

The invention may be more fully understood by reading the following description of the preferred embodiments of the invention in conjunction with the appended drawing wherein.

DETAILED DESCRIPTION

Figure 1:
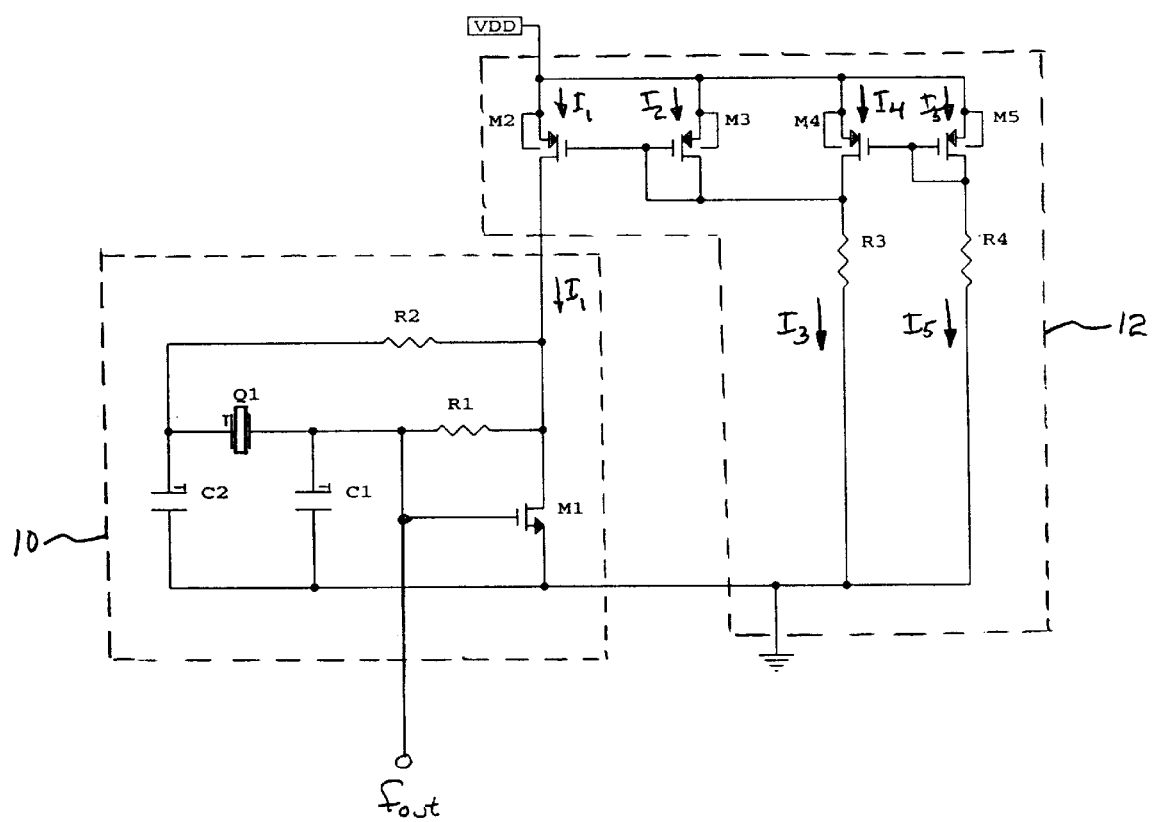
FIG. 1 is a schematic diagram of an embodiment of a temperature stabilized CMOS oscillator of the present invention.

A temperature stabilized CMOS oscillator circuit is disclosed that compensates for gain variation of the oscillator's CMOS transistor by canceling the transistor gain variation over temperature. Having constant gain over temperature maintains a constant drive level to a crystal in the oscillator circuit. Maintaining a constant drive level to the crystal reduces starting and spurious response problems in the crystal oscillator over temperature.

The present invention is shown in exemplary fashion in FIG. 1. A crystal oscillator 10 comprising resistors R1 and R2, capacitors C1 and C2, crystal Q1, and CMOS oscillator transistor M1 are shown interconnected as a Pierce oscillator well known in the art. Colpifts, Hartley, and Clapp oscillators and variations thereof also well known in the art may be substituted for the Pierce crystal oscillator 10 of FIG. 1. An output $f_o$ is taken from the gate of CMOS transistor M1 in the oscillator of FIG. 1.

There are two major factors that influence the gain of the CMOS transistor M1 in any of the crystal oscillator configurations that may be used in FIG. 1, the transistor's temperature and the transistor's bias current. The gain of the integrated CMOS transistor M1 decreases with increasing temperature. The gain of the transistor M1 at −55° C. is in excess of twice its gain at +105° C. To counteract this temperature effect, increasing the biasing current through the CMOS transistor M1 can increase the gain of the transistor.

An innovative bias circuit 12 in FIG. 1 is disclosed that increases the CMOS transistor bias current as the temperature increases to nearly cancel the decrease in gain as the temperature increases, resulting in a very nearly constant transistor/oscillator gain over temperature.

The temperature compensating bias circuit 12 includes CMOS transistors M2, M3, M4, and M5 and resistors R3 and R4 interconnected as shown in FIG. 1. The bias circuit 12, comprising a primary current mirror with a primary pair of CMOS transistors M2 and M3 and secondary current mirror with a secondary pair of CMOS transistors M4 and M5 and temperature variable resistors R3 and R4, is used as a bias current source to the oscillator CMOS transistor M1. Current mirrors are well known in the art of analog circuit design and integrated circuit design. The temperature variable resistors are very common in CMOS integrated circuit processes. The temperature variable resistors may have large or small temperature coefficients depending on resistor type. With these types of available resistors, it is possible to create a current source that has either a negative or positive temperature coefficient. In the case of the CMOS crystal oscillator 10, the goal is to increase gain of the oscillator transistor M1 at higher temperatures by increasing bias current, and so a positive temperature coefficient current source is desired.

The drain of transistor M2 is the current source output of the current mirror bias circuit 12. The primary current mirror between transistor M2 and transistor M3 establishes an output current $I_1$ at the drain of transistor M2 that is a mirror of a current $I_2$ in transistor M3. The output current $I_1$ is a supply current from the bias circuit 12 to the oscillator 10. The current $I_2$ in transistor M3 is a primary current mirror current set by a current $I_3$ in resistor R3 minus a current $I_4$ in transistor M4. The secondary current mirror between transistor M4 and transistor M5 establishes the current $I_4$ in the drain of transistor M4. A current $I_5$ is a secondary current mirror current in resistor R4 that sets the current $I_5$ in transistor M5. Resistor R4 has a high positive temperature coefficient and resistor R3 has a low positive temperature coefficient. The low temperature coefficient resistor R3 establishes the basic source current $I_3$.

The secondary current mirror formed with transistor M4 and M5 and the high temperature coefficient resistor R4 is used to divert current from the primary current mirror. The secondary current mirror diverts the most current at low temperatures when the resistance of resistor R4 is the smallest and diverts the least at high temperatures. This results in the primary current mirror output current $I_1$ having the least source current when it is cold (the most is diverted) and the most source current when it is hot (the least is diverted), as desired.

This temperature coefficient can then be selected to provide a bias current change that nearly cancels the gain variation due to the temperature change.

An example of operation of the bias circuit 12 of the present invention is shown in the table below. At 25° C. the value of R3 is 18,000 ohms and has a temperature coefficient (TC) of 6.4E−4 per degree C and R4 has a value of 34,000 ohms with a TC of 5.7E−3 per degree C. The values of R3 and R4 change as shown in the table over the temperature range of −55° C. to 125° C. in this example. The current $I_3$ in resistor R3 in microamperes ($\mu a$) and the current $I_5$ in resistor R4 in microamperes vary as shown over temperature. The primary current mirror output current $I_1$ is the drain current of transistor M2 in milliamperes (ma) and is also the supply current of the oscillator transistor M1. As can be seen in the table the CMOS oscillator transistor supply current $I_1$ varies over three to one over the temperature range to stabilize the gain of transistor M1.

|  | −55° C. | 25° C. | 125° C. |
|---|---|---|---|
| R3 (ohms) | 17,078 | 18,000 | 19,152 |
| R4 (ohms) | 18,496 | 34,000 | 53,380 |
| $I_3$ ($\mu a$) | 162.8 | 156.1 | 151.4 |
| $I_5$ ($\mu a$) | 142.7 | 82.3 | 55.8 |
| $I_1$ (ma) | 0.342 | 0.829 | 1.066 |

The invention has been simulated and significantly improves gain stability. Without the temperature compensating bias network 12, the gain of the oscillator circuit 10 changed 113% when the temperature varied from −55° C. to +125° C. With the temperature compensating bias network 12, the gain of the oscillator circuit 10 changed 20%. This is an improvement of more than 5 to 1.

The temperature stabilized oscillator circuit of the present invention may be incorporated on a CMOS application specific integrated circuit (ASIC) chip with the exception of the crystal. Other analog functions such as amplifiers may be included on the same ASIC chip.

It is believed that the temperature stabilized CMOS oscillator circuit of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A temperature stabilized CMOS oscillator circuit having stabilized gain over temperature comprising:
    a crystal oscillator for providing an output signal said crystal oscillator further comprising a CMOS oscillator transistor; and
    a bias circuit connected to the crystal oscillator as a current source to provide a supply current to the CMOS oscillator transistor and to vary the supply current over temperature to provide the stabilized gain, wherein the bias circuit further comprises:
        a primary current mirror connected to the crystal oscillator to provide a supply current to the CMOS oscillator transistor; and
        a secondary current mirror connected to the primary current mirror to divert current from the primary current mirror to vary the supply current over temperature.

2. The temperature stabilized CMOS oscillator of claim 1 wherein the crystal oscillator is from the group consisting of Pierce, Colpitts, Clapp, and Hartley.

3. The temperature stabilized CMOS oscillator of claim 1 wherein the primary current mirror comprises:
   a primary pair of CMOS transistors connected as a current mirror current source; and
   a resistor with a low positive temperature coefficient connected to the primary pair of CMOS transistors to set a primary current mirror current that sets the supply current.

4. The temperature stabilized CMOS oscillator of claim 3 wherein the secondary current mirror comprises:
   a secondary pair of CMOS transistors connected as a secondary current mirror current source; and
   a resistor with a high positive temperature coefficient connected to the secondary pair of CMOS transistors to set a secondary current mirror current that diverts current from the primary current mirror current.

5. A temperature stabilized CMOS oscillator circuit having stabilized gain over temperature comprising:
   a crystal oscillator for providing an output signal said crystal oscillator further comprising a CMOS oscillator transistor;
   a primary current mirror connected to the crystal oscillator to provide a supply current to the CMOS oscillator transistor; and
   a secondary current mirror connected to the primary current mirror to ,divert current from the primary current mirror to vary the supply current over temperature to provide the stabilized gain.

6. The temperature stabilized CMOS oscillator of claim 5 wherein the primary current mirror comprises:
   a primary pair of CMOS transistors connected as a current mirror current source; and
   a resistor with a low positive temperature coefficient connected to the primary pair of CMOS transistors to set a primary current mirror current that sets the supply current.

7. The temperature stabilized CMOS oscillator of claim 6 wherein the secondary current mirror comprises:
   a secondary pair of CMOS transistors connected as a secondary current mirror current source; and
   a resistor with a high positive temperature coefficient connected to the secondary pair of CMOS transistors to set a secondary current mirror current that diverts current from the primary current mirror current.

\* \* \* \* \*